United States Patent [19]

Huisman et al.

[11] Patent Number: 5,008,590
[45] Date of Patent: Apr. 16, 1991

[54] DISPLAY ARRANGEMENT HAVING PIN DIODE SWITCHING ELEMENTS

[75] Inventors: Frederikus R. J. Huisman; Gerrit Oversluizen; Jan W. D. Martens, all of Eindhoven, Netherlands

[73] Assignee: U.S. Philips Corp., New York, N.Y.

[21] Appl. No.: 412,024

[22] Filed: Sep. 25, 1989

[30] Foreign Application Priority Data

Sep. 30, 1988 [NL] Netherlands ............... 8802409

[51] Int. Cl.⁵ ................ H01L 29/06; H01L 29/44
[52] U.S. Cl. ................................ 313/500; 340/718; 340/719; 357/13
[58] Field of Search ............ 313/499, 500; 340/718, 340/719; 357/13

[56] References Cited

U.S. PATENT DOCUMENTS 4,583,087  4/1986  van de Venne .............. 340/719
4,748,445  5/1988  Togashi et al. .............. 340/718 X
4,811,006  3/1989  Kuijk .......................... 340/719

*Primary Examiner*—Sandra L. O'Shea
*Attorney, Agent, or Firm*—Steven R. Biren

[57] ABSTRACT

For satisfactory operation of a display arrangement having an electro-optical display medium and picture elements arranged between row and column electrodes and connected in series with an anti-parallel arrangement of PIN diodes, the diodes should have a small reverse current notwithstanding any ambient radiation present. In a display arrangement according to the invention, a small photo-current in the reverse direction is obtained due to the fact that the i-region and the p- or n-type region do not adjoin each other directly in the proximity of the edge of the mesa-shaped PIN diode. The region within which the aforementionhed regions adjoin each other is preferably located at a distance from the edge of the mesa-shaped PIN diode amounting to at least once the penetration depth of the ambient radiation plus the diffusion length of charge carriers in the i-region. Due to such a construction of the PIN diode, the electrical field becomes substantially zero with reverse voltage in the proximity of the edge of the diode and hence ther sensitivity of a display arrangement according to the invention to ambient radiation, especially to the ambient radiation laterally incident on the diode, becomes considerably lower.

8 Claims, 3 Drawing Sheets

DISPLAY ARRANGEMENT HAVING PIN DIODE SWITCHING ELEMENTS

BACKGROUND OF THE INVENTION

The invention relates to display arrangement comprising an electro-optical display medium between two supporting plates, a system of picture elements arranged in rows and columns, each picture element being constituted by two picture electrodes provided on the surfaces of the supporting plates facing each other, a system of row and column electrodes for driving the picture elements, the row electrodes being provided on one supporting plate and the column electrodes being provided on the other supporting plate, and a system of switching elements, a switching element being included between at least one row electrode and one column electrode in series with each picture element, which switching elements comprise at least one PIN diode having a mesa-shaped semiconductor body, which comprises in a sectional view transverse to a supporting plate in order of succession at least a first semiconductor region of a first conductivity type having a comparatively high doping concentration, a second semiconductor region of the first or a second conductivity type having a comparatively low doping concentration and a third semiconductor region of the second conductivity type having a comparativelY high doping concentration, the first and third semiconductor regions being provided with a connection conductor.

Such, a display arrangement is suitable to display alphanumeric and video information by means of passive electro-optical display media, such as liquid crystals, electrophoretic suspensions and electrochrome materials.

A display arrangement of the kind mentioned above is known from British Patent Application 2129183, in which a detrimental effect of ambient radiation on the operation of the display arrangement and especially on the switching elements is mentioned. If this switching element comprises one or more diodes, one of the requirements is that, when a reverse voltage appears at the diode, the current produced by the ambient radiation is as small as possible in order to ensure that the voltage across the picture element is maintained. In the said British Patent Application it is noted that with the configuration of diodes used therein, i.e. an anti-parallel arrangement of an equal number of diodes, the influence of the ambient radiation is partly eliminated. Further, it is noted in the said British Patent Application that the use of non-transparent conductors prevents light from penetrating into the semiconductor body.

A disadvantage of the known arrangement is that with the given form of the connection conductor a part of the ambient radiation, i.e. the light laterally incident on the semiconductor body, can still penetrate into the semiconductor body. It is technologically unattractive to shield incident radiation from all the side faces of the semiconductor body of a diode by covering it with nontransparent connection conductors.

SUMMARY OF THE INVENTION

The invention has inter alia for an object to obviate the disadvantage of the sensitivity of the semiconductor body to laterally incident light.

The invention is based inter alia on the recognition of the fact that this object can be achieved in that the diode itself, i.e. the semiconductor body of the diode, is made less sensitive to laterally incident radiation. The invention is further based on the recognition of the fact that for this purpose the profile of the electric field in the semiconductor body can be influenced.

According to the invention, a display arrangement of the kind mentioned above is for this purpose characterized in that a region within which the second semiconductor region and the third semiconductor region adjoin each other is located, viewed in projection, within the edge of the second semiconductor region. The electric field at and in the proximity of the edge of the second semiconductor region will be at least substantially equal to zero because the region in which the junction between the second and third semiconductor regions is formed does not reach at any point the edge of the second semiconductor region. The extent of the shielding thus obtained of the semiconductor body from ambient radiation and the associated reduction of the current strength in the reverse direction will depend inter alia upon the distance of the region within which the second and third semiconductor regions adjoin each other from the edge of the second semiconductor region. The shielding also depends upon the penetration depth of the ambient radiation into the second semiconductor region and also upon the diffusion length of charge carriers in the second semiconductor region. In general, it can be said that: as the aforementioned distance from the edge is greater, the shielding is better.

For a good shielding from laterally incident ambient radiation, it is desirable that the region in which no charge carriers generated by light are collected has at least a thickness—calculated from the side of the second semiconductor region—corresponding to once the penetration depth of the light plus the diffusion length of charge carriers. The term "penetration depth" is to be understood (here) to mean that depth at which the intensity of the light has decreased by a factor 1/e. The distance of the aforementioned region from the edge of the second semiconductor region must preferably be at least equal to this penetration depth plus the diffusion length of charge carriers. A second embodiment is therefore characterized in that the distance of the region within which the second and third semiconductor regions adjoin each other from the edge of the second semiconductor region corresponds to at least once the penetration depth of ambient radiation plus the diffusion length of charge carriers. The semiconductor body of the PIN diodes used in a display arrangement according to the invention is preferably made of hydrogenated amorphous silicon ($\alpha$-Si:H). For this material, the penetration depth for the conventional ambient radiation ($\lambda = 450$ to $750$ nm corresponding to the limits of the spectrum of a fluorescent lamp) is about $0.4$ $\mu$m. The diffusion length of charge carriers is this material can be estimated at about $1$ to $2$ $\mu$m. In connection with what has been stated before and in connection with the usual tolerances in the alignment accuracy during the different photolithographic processing steps of the method of manufacturing a diode in a display arrangement according to the invention, preferably a distance of about $5$ $\mu$m is chosen.

An additional advantage of a display arrangement according to the invention resides in the fact that also any moderate quality of the interface between the sides of the semiconductor body and an insulating layer present thereon has a smaller influence on the current in the reverse direction. In fact, the length of a surface leakage path extending from the first semiconductor region to the third semiconductor region, measured along the outer side of the semiconductor body, will be greater in such a display arrangement than in &he usual display arrangement. As a result, the resistance of such a leakage path increases and therefore the leakage current through such a path decreases.

A further embodiment of a display arrangement according to the invention is characterized in that between the second semiconductor region and the third semiconductor region is disposed an insulating layer which locally has a window at the area of which the second and third semiconductor regions adjoin each other. Inter alia because of the suppression of surface leakage currents and the prevention of shortcircuits, it is desirable that those parts of the semiconductor body and especially of the second semiconductor region which are not covered with another semiconductor region are covered with an insulating layer. In this embodiment, this condition is fulfilled and at the same time several manufacturing advantages are obtained, such as a small number of required photolithographic processing steps.

The semiconductor body of the PIN diodes used in a display arrangement according to the invention is preferably manufactured from layers comprising α-Si:H. Since it has been found that it is more difficult to grow from this material layers of high quality on a layer of the p-conductivity type, a further embodiment of a display arrangement according to the invention is characterized in that the first semiconductor region is of the n-conductivity type. The region of the p-conductivity type required for a PIN diode is then consequently provided as the last region and the diode obtained is designated as a NIP diode.

The invention not only relates to a display arrangement, but also to a supporting plate provided with a diode and suitable for use in such a display arrangement and further to a method of manufacturing such a supporting plate.

As electro-optical medium in a display arrangement according to the invention, different materials may be used, such as a liquid crystal, an electrophoretic suspension or an electrochrome material.

BRIEF DESCRIPTION OF THE DRAWING

The invention will now be described with reference to an embodiment and the drawing, in which.

Figure 1:
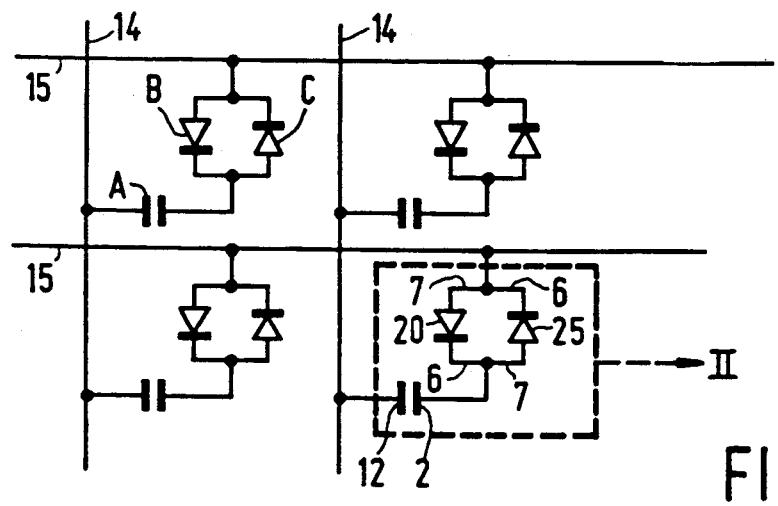
FIG. 1 shows diagrammatically a diagram of part of a display arrangement according to the invention.

The Figures are schematic and not drawn to scale, while more particularly the dimensions in the direction of thickness are exaggerated for the sake of clarity. Corresponding parts are generally designated by the same reference numerals in the different embodiments. Semiconductor regions of the same conductivity type are generally cross-hatched in the cross-sections in the same direction.

DESCRIPTION OF THE PREFERRED EMBODIMENTS

FIG. 1 shows diagrammatically a diagram of a part of a display arrangement according to the invention. This part of the arrangement comprises row electrodes 15 and column electrodes 14, between which picture elements A are disposed. Between a picture element A and a row electrode 15 are disposed two semiconductor diodes B and C, which are connected in parallel opposition and together constitute a switching element. The diodes B and C comprise a semiconductor body 20 and 25, respectively. These semiconductor bodies are connected to a row electrode 15 and —via the picture element A comprising two picture electrodes 2 and 12—to a column electrode 14 through connection conductors 6 and 7.

Figure 2:
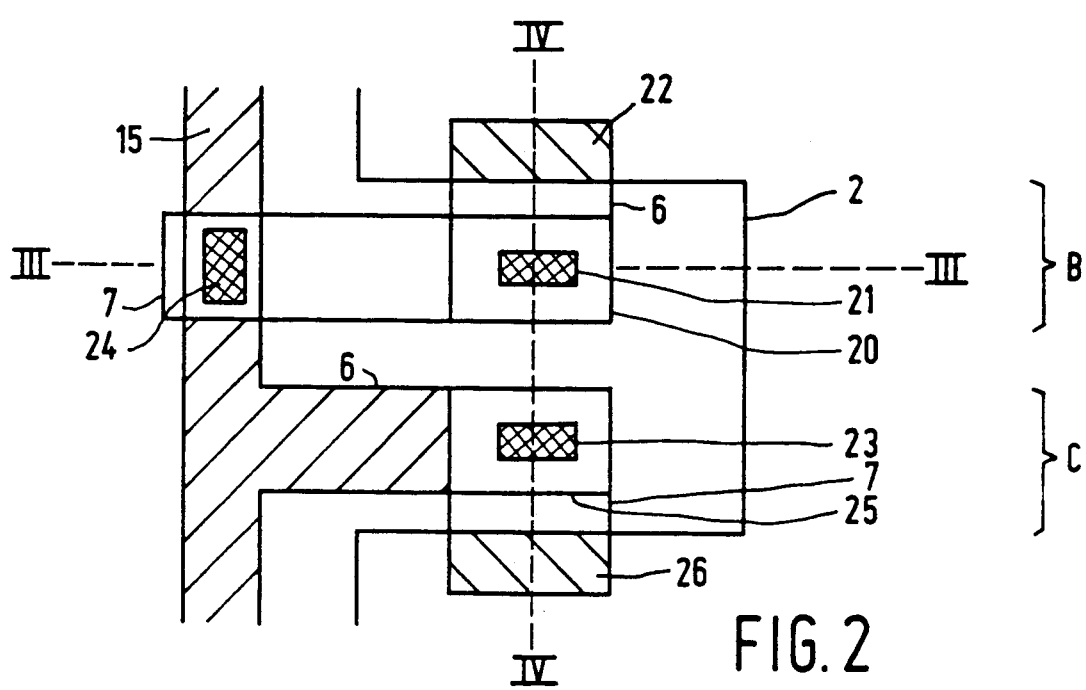
FIG. 2 shows diagrammatically in plan view the part of a display arrangement according to the invention located within the dotted lines indicated in FIG. 1 by II.

FIG. 2 shows diagrammatically in plan view the part of a display arrangement according to the invention located within the dotted lines indicated by II in FIG. 1. For the sake of clarity, in this FIG. the upper supporting plate on which inter alia a column electrode 14 and a picture electrode 12 are disposed is omitted and only a plan view of the lower supporting plate of the display arrangement is shown. On this plate are disposed a row electrode 15, a picture electrode 2 of the picture element A and the two diodes B and C. This part of the display arrangement comprises in plan view inter alia a semiconductor body 20 of the diode B connected on the lower side through the connection conductor 6 and a contact region 22 to the picture electrode 2, while the upper side is connected via the contact opening 21, the connection conductor 7 and the contact opening 24 to the row electrode 15. This part further comprises a semiconductor body 25 of the diode C connected on the lower side through a connection conductor 6 to the row electrode 15 and connected on the upper side through the contact opening 23, the connection conductor 7 and the contact region 26 to the picture electrode 2. Thus, the diodes B and C are arranged in parallel opposition. The lengths and widths of the square and mesa-shaped semiconductor bodies are about 30 μm, while the lengths and widths of the contact openings are about 20 μm. The connection conductors 6 and 7 and the row electrode 15 as well as the column electrode 14 not shown here comprise, for example, gold, chromium or aluminum. The picture electrode 2 comprises, for example, indium tin oxide (ITO), which is transparent to light.

Figure 3:
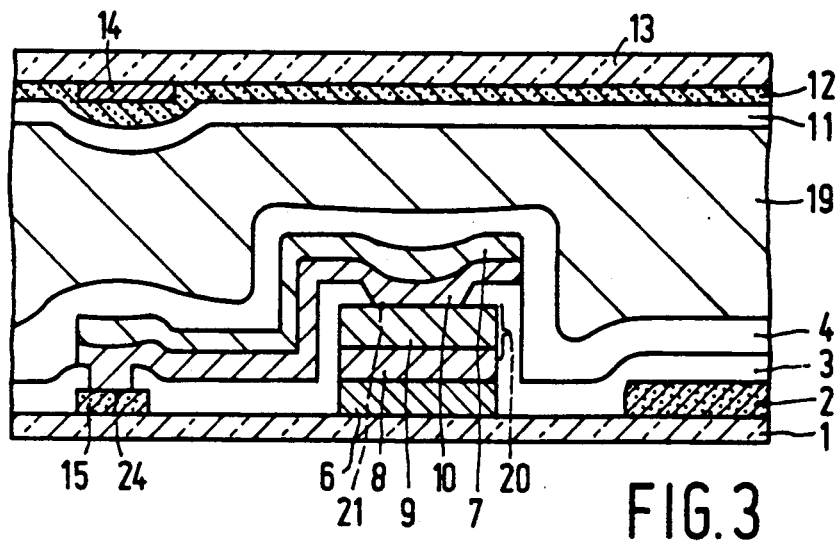
FIGS. 3 and 4 show diagrammatically a cross-section taken on the lines III—III and IV—IV in FIG. 2 of a display arrangement according to the invention.
Figure 4:
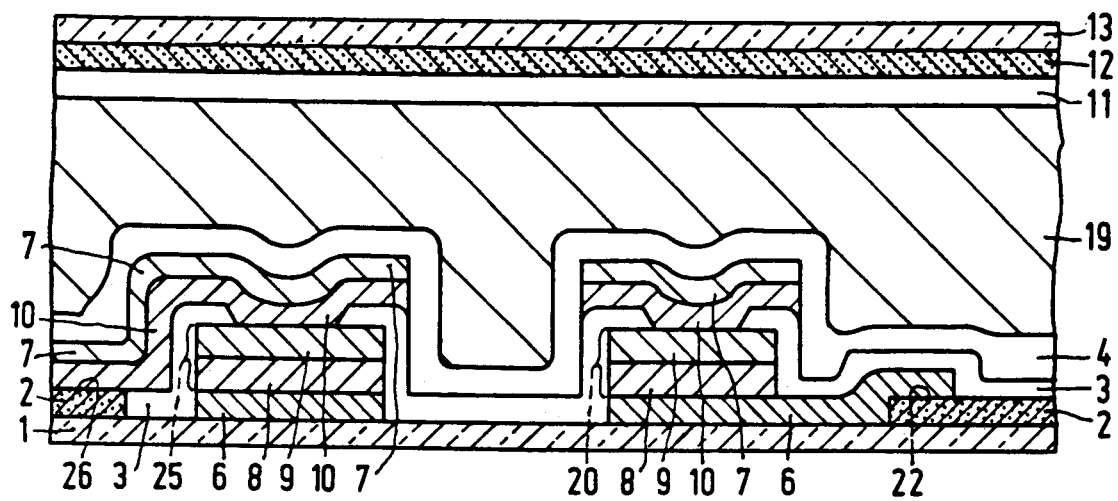

FIGS. 3 and 4 show diagrammatic cross-sections taken on the lines III—III and IV—IV in FIG. 2 of a display arrangement according to the invention. The arrangement comprises (cf. FIG. 3) inter alia a first substrate 1 of, for example, glass and an insulating layer 3 of, for example, silicon dioxide or silicon nitride on it. A picture electrode 2, in this example of ITO (=Indium Tin Oxide) is present thereunderneath. On the substrate 1 are locally disposed a row electrode 15 and a connection conductor 6, above which a semiconductor body 20 is located. This connection conductor is connected in a region lying outside this cross-section via a contact region 22 to a picture electrode 2. The semiconductor body comprises a structure comprising successively at least a first semiconductor region 8 of the n-conductivity type having a doping concentration of about $10^{19}$ to $10^{20}$ at/cm$^3$ and a thickness of about 50 nm. On this region is disposed a second semiconductor region 9, in this example of the $n^-$-conductivity type having a very low doping concentration and a thickness of about 400 nm, on which a third semiconductor region 10 of the p-conductivity type is disposed having a doping concentration of $10^{19}$ to $10^{20}$ at/cm$^3$ and a thickness of about 30 nm. In this example the semiconductor regions are made of $\alpha$-Si:H. Between the second semiconductor region 9 and the third semiconductor region 10 is disposed the insulating layer 3, which is locally interrupted, while the second semiconductor region 9 and the third semiconductor region 10 adjoin each other at the area of this interruption, which coincides with the contact opening 21. This interruption everywhere has a distance of 5 $\mu$m from the edge of the second semiconductor region 9, which edge coincides with the edge of the semiconductor body 20. On the semiconductor structure is disposed a connection conductor 7, which is connected together with the semiconductor layer 10 to a row electrode 15. A first orientation layer 4 comprising, for example, polyimide is provided above it. Finally, in order of succession a layer 19 comprising, for example, liquid crystals, a second orientation layer 11 also comprising, for example, polyimide, a picture electrode 12 comprising ITO and a second substrate 13 comprising, for example, glass are disposed above it. Besides the layers 11 and 12, also a column electrode 14 comprising, for example gold, chromium or aluminum is provided on the substrate 13. The function of a column electrode may also be fulfilled by the ITO layer 12 because the latter is itself a good conductor. The semiconductor region 10 extends over the insulating layer 3 at least as far as the edges of the mesa-shaped semiconductor body 20. This also applies to the connection conductor 7. Locally, i.e. at the area at which this is necessary to reach the contact opening 24 and the row electrode 15, the semiconductor region 10 and the connection conductor 7 extend still further over the insulating layer 3. In the display arrangement according to the invention shown here, shielding from laterally incident light is obtained in that the region within which the second semiconductor region 9 and the third semiconductor region 10 adjoin each other (for example the region 21) is located, viewed in projection, within the edge of the second semiconductor region 9, which edge coincides here with the edge of the mesa-shaped semiconductor body (for example the semiconductor body 20). The shielding from laterally incident ambient radiation is obtained in this example in that the distance of the region within which the semiconductor regions 9 and 10 adjoin each other from the edge of the semiconductor region 9, which is in this example about 5 $\mu$m, is greater than the penetration depth of the ambient radiation plus the diffusion length of charge carriers. FIG. 4 shows besides the semiconductor body 20 (of the diode B) also a semiconductor body 25 (of the diode C). In the contact region 26, the semiconductor layer 10 and the connection conductor 7 of the semiconductor body 25 are connected to the picture electrode 2. In the contact region 22, the connection conductor 6 of the semiconductor body 20 is connected to the picture electrode 2.

Figure 5:
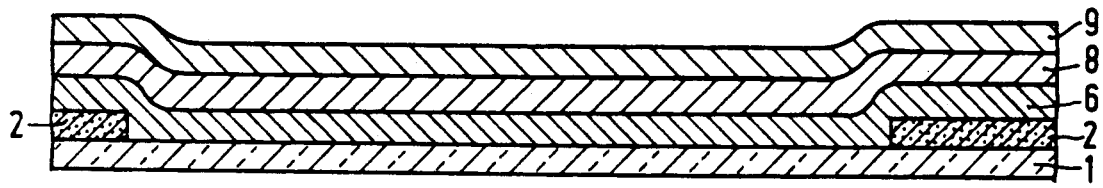
FIGS. 5 to 7 show diagrammatically in cross-section taken on the line IV—IV the display arrangement of FIG. 2 at successive manufacturing stages.
Figure 6:
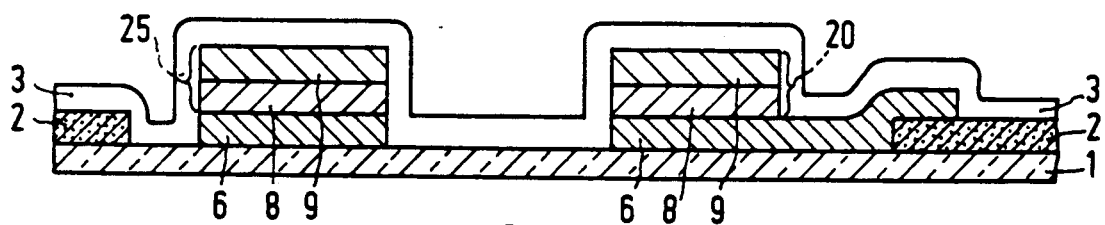
Figure 7:
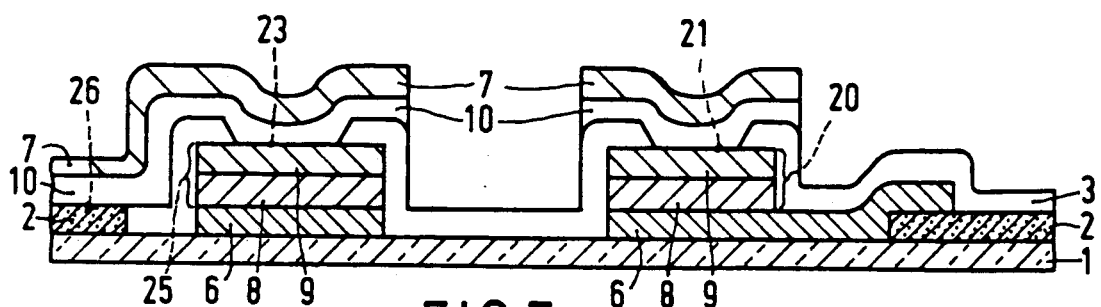

FIGS. 5 to 7 show the display arrangement according to the invention of FIG. 2 diagrammatically in a cross-section taken on the line IV—IV and at successive stages of manufacturing. A method according to the invention of manufacturing such a display arrangement comprises inter alia the following processing steps: After cleaning in a usual manner first a picture electrode 2 comprising indium tin oxide (ITO) having a usual composition and a usual thickness is provided on a glass substrate 1 having usual dimensions by means of commonly used techniques, whereupon this picture electrode is locally removed by means of photolithography and commonly used etchants. Subsequently, a conductive layer 6 of gold, chromium or aluminum having a thickness of about 150 nm is provided by means of the sputtering technique. By means of PECVD (=Plasma Enhanced Chemical Vapor Deposition) from silane (SiH$_4$) the semiconductor layers 8 and 9 consisting of hydrogenated amorphous silicon ($\alpha$-Si:H) are successively provided on this layer (cf. FIG. 5). The semiconductor layer 8 is of the $n^-$-conductivity type and has a very high doping concentration of about $10^{19}$ to $10^{20}$ at/cm$^3$ and a thickness of about 50 nm. The doping in this region is obtained by adding 1% of phosphine (PH$_3$) to the silane. The semiconductor layer 9 is of the $n^-$-conductivity type, has a very low doping concentration, as a result of which the resistivity of the region is about $10^9$ $\Omega$cm, and has a thickness of about 400 nm. Subsequently (cf. FIG. 6), the mesa-shaped semiconductor bodies 20 and 25 are formed by means of photolithography and commonly used etchants, after which in a similar manner connection conductors 6 are formed, on which bear the semiconductor bodies 20 and 25. The semiconductor bodies 20 and 25 in this example have a square cross-section having a dimension of about $30\times30$ $\mu$m$^2$ and at this instant comprise only the semiconductor regions 8 and 9 bearing on a connection conductor 6. It should be noted that it is not necessary at all for the effect according to the invention that the semiconductor bodies 20 and 25 have a square cross-section Other geometries, such as rectangular or circular geometries, are conceivable. By means of, for example, the sputtering technique or the aforementioned PECVD technique, an insulating layer 3 of, for example, silicon dioxide (SiO$_2$) having a thickness of about 350 nm is provided on the resulting structure (cf. FIG. 6). Subsequently, contact openings 21 and 23 and a contact region 26 are formed by means of photolithography and an etchant on the basis of hydrofluoride (HF). The dimensions of the contact openings are approximately $20\times20$ $\mu$m$^2$ (cf. FIG. 7). A third semiconductor layer 10 is then provided, which forms the third semiconductor region 10 and is also made of hydrogenated armorphous silicon of the p-conductivity type having a high doping concentration, in this example of $10^{19}$ to $10^{20}$ at/cm$^3$ and a thickness of about 30 nm. This layer is also provided by means of, for example, PECVD from silane (SiH$_4$). In this case, the doping is obtained by adding 1% of diborane (B$_2$H$_6$) to the silane. Subsequently, a metal layer 7 of gold, chromium or aluminum having a thickness of about 150 nm is provided by means of, for example, a sputtering technique. By means of photolithography and commonly used etchants, the layers 7 and 10 are now locally removed. Subsequently, an orientation layer 4 of, for example, polyimide is provided on the resulting structure, after which the lower supporting plate shown in FIG. 4 is obtained. By means of a second substrate, which is provided in a usual manner with a picture electrode 12 of ITO, with an orientation layer 11 of, for example, polyimide and with a column electrode 14 of gold, chromium or aluminum, the display arrangement can now be assembled and be filled, for example, with a medium 19 consisting of, for example, liquid crystals in a usual manner. Thus, the complete structure of FIG. 4 is obtained.

Figure 8:
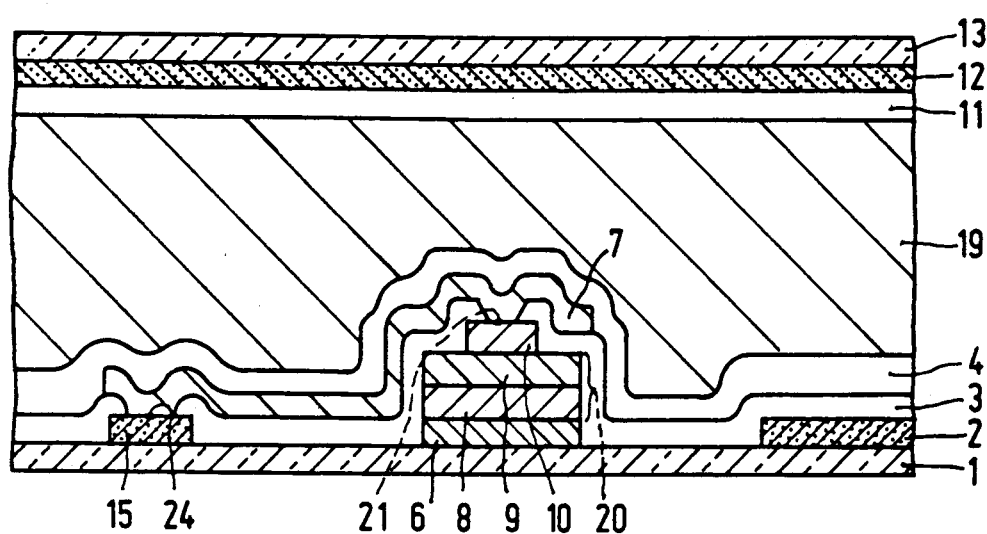
FIG. 8 shows diagrammatically a cross-section taken on the line III—III in FIG. 2 of a display arrangement according to the invention in another embodiment.

FIG. 8 shows diagrammatically a cross-section taken on the line III—III in FIG. 2 of a display arrangement according to the invention in another embodiment. A difference with the structure of FIG. 3 resides in the third semiconductor region 10, which is now present only at the area of the region 21. The manufacture of the structure of FIG. 8 is effected for the major part in the same manner as the manufacture of the structure of FIG. 3. The differences are as follows: The semiconductor layers 8, 9 and 10 are now provided directly after each other, after which the mesa-shaped bodies 20 and 25 (in this cross-section only the semiconductor body 20 is visible) are etched. Before an insulating layer 2 is provided, first the semiconductor layer 10 is removed outside the region 21 by means of photolithography and commonly used etchants. In the display arrangement according to the invention shown here, shielding from laterally incident light is obtained in that the region within which the second semiconductor region 9 and the third semiconductor region 10 adjoin each other (for example region 21 in FIG. 8) is located, viewed in projection, within the edge of the second semiconductor region 9, which edge coincides here with the edge of the mesa-shaped semiconductor body (for example the semiconductor body 20 in FIG. 8). The shielding is strong because the distance of the region within which the semiconductor regions 9 and 10 adjoin each other from the edge of the semiconductor region 9 is about 5 $\mu$m and is greater than the penetration depth of the ambient radiation plus the diffusion length of charge carriers.

Although in the present application the invention has been described for a display arrangement with a given circuit diagram, the use of the invention is also of great importance for other circuits for the same reasons as in the examples given.

The invention is therefore not limited at all to the embodiments given, but relates to all forms of display arrangements in which the switching elements comprise diodes, in which a junction is present, of which it is desirable that the reverse current is low notwithstanding the presence of ambient radiation.

It should further be noted that besides the structures of, for example, FIG. 3 and FIG. 8, still other structures are conceivable in which the invention described here is embodied, that is to say structures in which the region within which the second semiconductor region adjoins the third semiconductor region is located, viewed in projection, within the edge of the second semiconductor region. For example, it is also possible to realize the region within which the second and first semiconductor regions adjoin each other in such a manner that, viewed in projection, it is located within the edge of the second semiconductor region. As a result, the shielding from laterally incident ambient radiation can still further be improved.

It should further be noted that the connection conductor present on the upper side of the mesa-shaped diode and on the third semiconductor region is preferably provided so that it covers at least the whole upper side of the diode. Since the materials usual for the manufacture of connection conductors comprise metals which are generally not transparent to the ambient radiation, good shielding from laterally incident ambient radiation is thus combined with good shielding from ambient radiation incident from above. It should further be noted that it is not necessary at all that the third semiconductor region is also present at every area under the connection conductor of the third semiconductor region. The third semiconductor region may be limited to within the edges of the mesa-shaped diode. In this case, only the connection conductor of this third semiconductor region extends locally (where this is required) over the insulating layer.

At the same time it will be apparent from what has been stated above that the invention is not limited to a display arrangement, but also includes a supporting plate suitable for use in such a display arrangement and a method of manufacturing such a supporting plate. It should then be noted that the different processing steps in the method according to the invention may be replaced by other commonly used processing steps. For example, the p- and n-type dopings of the semiconductor layers in which the first and third semiconductor regions are formed may also be obtained by means of diffusion or ion implantation. The semiconductor regions are then formed by etching a mesa-shaped semiconductor body in the semiconductor layer structure. It is also possible to form the first and especially the third semiconductor region by diffusion or implantation. If, for example, the third semiconductor region should be formed in such a manner, local implantation or diffusion can be carried out in the second semiconductor region. The third semiconductor region is thus formed as a zone sunken into the second semiconductor region. In these respects, the technology of hydrogenated amorphous silicon, which material is preferably used for the manufacture of a display arrangement according to the invention, does not deviate essentially from the technology of monocrystalline silicon. In the last-mentioned technology, a large number of alternatives and commonly used processing steps and embodiments exist beside each other.

We claim:

1. A display arrangement comprising an electro-optical display medium between two supporting plates, a system of picture elements arranged in rows and columns, each picture element comprising two picture electrodes provided on the surface of the supporting plates facing each other, a system of row and column electrodes for driving the picture elements, the row electrodes being provided on one supporting plate and the column electrodes being provided on the other supporting plate, and a system of switching elements, a switching element being included between at least one row electrode and one column electrode in series with each picture element, which switching element comprises at least one PIN diode having a mesa-shaped semiconductor body, which comprises in a sectional view transverse to a supporting plate in order of succession at least a first semi-conductor region of a first conductivity type having a comparatively high doping concentration, a second semiconductor region of one of the first and a second conductivity type having a comparatively low doping concentration, and a third semiconductor region of the second conductivity type having a comparatively high doping concentration, the first and third semiconductor regions being provided with a connection conductor, characterized in that a region within which the second semiconductor region and the third semiconductor region adjoin each other is located, viewed in projection, inset within the edge of the second semiconductor region.

2. A display arrangement as claimed in claim 1, characterized in that the distance of the region within which the second and third semiconductor regions adjoin each other from the edge of the second semiconductor region corresponds to at least once the penetration depth of ambient radiation plus the diffusion length of charge carriers.

3. A display arrangement as claimed in claim 1, characterized in that the distance of the region within which the second and third semiconductor regions adjoin each other from the edge of the second semiconductor region corresponds to at least 2 $\mu$m.

4. A display arrangement as claimed in claim 1, 2 or 3, characterized in that the second and third semiconductor regions are each constituted by a semiconductor layer and an insulating layer is provided between these semiconductor layers, said insulating layer being locally interrupted, the semiconductor layers adjoining each other at the area of this interruption.

5. A display arrangement as claimed in claim 1, 2 or 3, characterized in that the first semiconductor region is of the n-conductivity type.

6. A display arrangement as claimed in claim 1, 2 or 3, characterized in that the semiconductor regions consist of $\alpha$-Si:H.

7. A supporting plate provided with at least one diode and suitable for use in a display arrangement as claimed in claim 1, 2 or 3.

8. A method of manufacturing a supporting plate as claimed in claim 6, characterized in that at least a metal layer, a first semiconductor layer of a first conductivity type having a comparatively high doping concentration, which constitutes the first semiconductor region, and a second semiconductor layer of the first or a second conductivity type having a comparatively low doping concentration, which constitutes the second semiconductor region, are successively provided on a substrate, in that the semiconductor layers are then etched to a mesa-shaped semiconductor body, in that an insulating layer is provided over the resulting structure, into which insulating layer a window is etched above the semiconductor body, this window being located, viewed in projection, within the edge of the second semiconductor layer, and in that a third semiconductor layer of a second conductivity type having a comparatively high doping concentration constituting the third semiconductor region is grown over the structure thus obtained.

* * * * *